US009871316B2

(12) United States Patent
Hayakawa et al.

(10) Patent No.: US 9,871,316 B2
(45) Date of Patent: Jan. 16, 2018

(54) ELECTRONIC DEVICE

(71) Applicant: Toshiba Memory Corporation, Minato-ku (JP)

(72) Inventors: Toshiyuki Hayakawa, Yokohama (JP); Shiro Harashima, Sagamihara (JP)

(73) Assignee: TOSHIBA MEMORY CORPORATION, Mintao-ku (JP)

( * ) Notice: Subject to any disclaimer, the term of this patent is extended or adjusted under 35 U.S.C. 154(b) by 0 days.

(21) Appl. No.: 15/255,695

(22) Filed: Sep. 2, 2016

(65) Prior Publication Data

US 2017/0214169 A1     Jul. 27, 2017

Related U.S. Application Data

(60) Provisional application No. 62/281,376, filed on Jan. 21, 2016.

(51) Int. Cl.
*H01R 13/447* (2006.01)
*G06F 1/16* (2006.01)
*H01R 24/60* (2011.01)
*H01R 107/00* (2006.01)

(52) U.S. Cl.
CPC ......... *H01R 13/447* (2013.01); *G06F 1/1656* (2013.01); *H01R 24/60* (2013.01); *H01R 2107/00* (2013.01)

(58) Field of Classification Search
CPC ............. H01R 13/447; H01R 13/4532; H01R 13/4536
See application file for complete search history.

(56) References Cited

U.S. PATENT DOCUMENTS

| 5,571,023 | A | * | 11/1996 | Anthony | H02G 3/14 220/242 |
| 5,713,756 | A | * | 2/1998 | Abe | H01R 13/501 439/404 |
| 5,779,506 | A | * | 7/1998 | Okabe | H01R 13/4361 439/752 |
| 7,214,075 | B2 | * | 5/2007 | He | H01R 13/5213 439/135 |
| 7,462,044 | B1 | | 12/2008 | Regen et al. | |
| 7,524,192 | B2 | * | 4/2009 | Cummings | H01R 13/5213 220/242 |

(Continued)

FOREIGN PATENT DOCUMENTS

| JP | 2006-301789 | 11/2006 |
| JP | 2015-111367 | 6/2015 |

*Primary Examiner* — Harshad C Patel
(74) *Attorney, Agent, or Firm* — Oblon, McClelland, Maier & Neustadt, L.L.P.

(57) ABSTRACT

According to an embodiment, an electronic device includes: a housing including a first face facing a first direction, a second face on an opposite side of the first face, and a third face adjacent to the first and second faces; a connector protruding from the third face; and a first cover connected to the housing, including a fourth face, and being pivotable between a first position where the fourth face faces the first direction and a second position where the fourth face faces the first face. The first cover includes a first stopper that, when the first cover pivots from the first position to the second position, contacts the connector and is elastically deformable in a direction that is a pivoting axial direction of the first cover and is a separating direction from the connector.

20 Claims, 11 Drawing Sheets

(56) References Cited

U.S. PATENT DOCUMENTS

| | | | |
|---|---|---|---|
| 7,789,680 B2* | 9/2010 | Hiew | H01R 13/44 |
| | | | 439/142 |
| D707,689 S | 6/2014 | Billington | |
| 8,974,338 B2* | 3/2015 | Holmes | B60K 6/365 |
| | | | 475/218 |
| 9,239,938 B2* | 1/2016 | Wieder | B29C 45/17 |
| 9,444,200 B2* | 9/2016 | Yen | H01R 24/60 |
| 2003/0139094 A1* | 7/2003 | Venditti | H01R 13/506 |
| | | | 439/596 |
| 2008/0026616 A1* | 1/2008 | Cummings | H01R 13/5213 |
| | | | 439/142 |
| 2011/0080326 A1* | 4/2011 | Won | H04B 1/08 |
| | | | 343/702 |
| 2011/0261524 A1* | 10/2011 | Wieder | B29C 45/17 |
| | | | 361/679.31 |
| 2015/0162690 A1 | 6/2015 | Kang | |

* cited by examiner

ELECTRONIC DEVICE

CROSS-REFERENCE TO RELATED APPLICATIONS

This application is based upon and claims the benefit of priority from U.S. Provisional Application No. 62/281,376, filed on Jan. 21, 2016; the entire contents of which are incorporated herein by reference.

FIELD

Embodiments described herein relate generally to an electronic device.

BACKGROUND

An electronic device includes a connector connected to another device or an apparatus, for example.

DETAILED DESCRIPTION

According to the present embodiment, an electronic device including: a housing including a first face that faces a first direction, a second face that is on an opposite side of the first face, and a third face adjacent to the first face and the second face; a connector protruding from the third face; and a first cover connected to the housing and includes a fourth face, the first cover being pivotable between a first position at which the fourth face faces the first direction and a second position at which the fourth face faces the first face, is provided. The first cover includes a first stopper that, when the first cover pivots from the first position to the second position, comes in contact with the connector and that is elastically deformable in a direction that is a pivoting axial direction of the first cover and that is a separating direction from the connector.

Hereinafter, the electronic device according to embodiments will be described with reference to the attached drawings. Note that the present invention is not limited by the embodiments.

First Embodiment

Hereinafter, a first embodiment will be described with reference to FIGS. 1 to 5. In the present description, a plurality of expressions is used occasionally regarding components according to the embodiment and description on the components. For the components and description on which the plurality of expressions has been made, another expression may be used other than expressions described herein. Furthermore, for the components and description on which the plurality of expressions has not been made, another expression may also be used other than expressions described herein.

Figure 1:
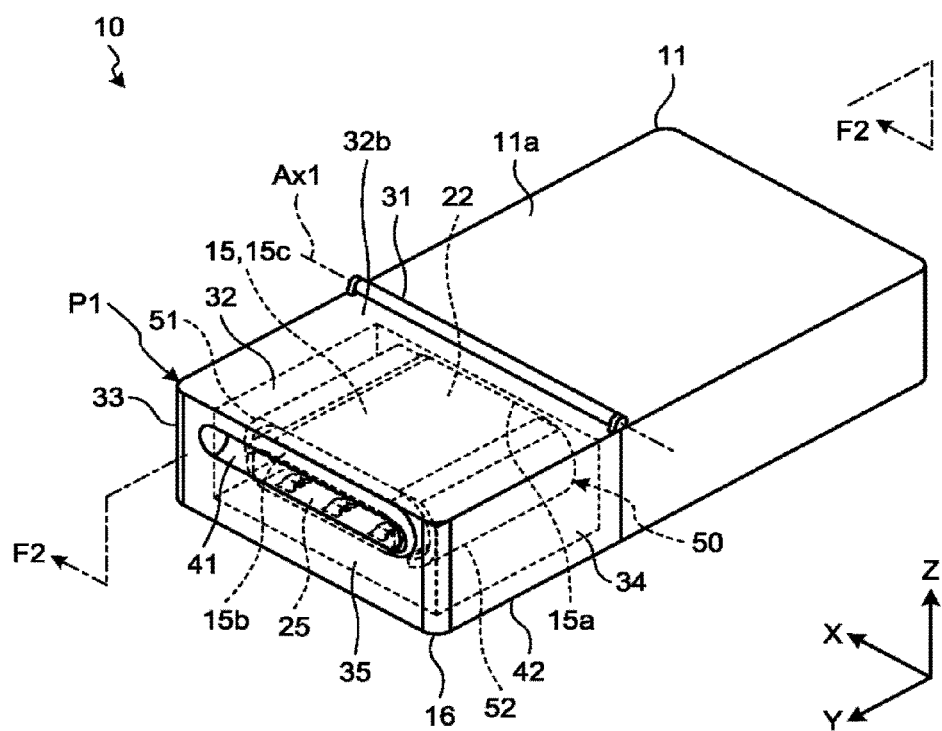
FIG. 1 is a perspective view of a USB drive according to a first embodiment.

FIG. 1 is a perspective view of a USB flash drive (hereinafter, referred to as a USB drive) 10 according to the first embodiment. The USB drive 10 is an example of an electronic device and can also be referred to, for example, as a semiconductor storage device, a semiconductor device, a storage device, an auxiliary storage device, a removable medium, or an apparatus. The electronic device may be, for example, a portable computer, a tablet, a television receiving apparatus, a display, a smartphone, a mobile phone, an IC recorder, a consumer electronics, an auxiliary storage apparatus such as a hard disk drive (HDD) or a solid state drive (SSD), a cable or an adaptor for connecting a device with another device, or another electronic device.

As illustrated in FIG. 1, the USB drive 10 according to the present embodiment is formed in a substantially cuboid shape, for example. The USB drive 10 may be formed in another shape. As illustrated in each of the drawings, an X-axis, a Y-axis, and a Z-axis are defined in the present description. Each of the X-axis, the Y-axis, and the Z-axis is orthogonal to each other. The X-axis is along a width of the USB drive 10. The Y-axis is along a length of the USB drive 10. The Z-axis is along a thickness of the USB drive 10.

Figure 2:
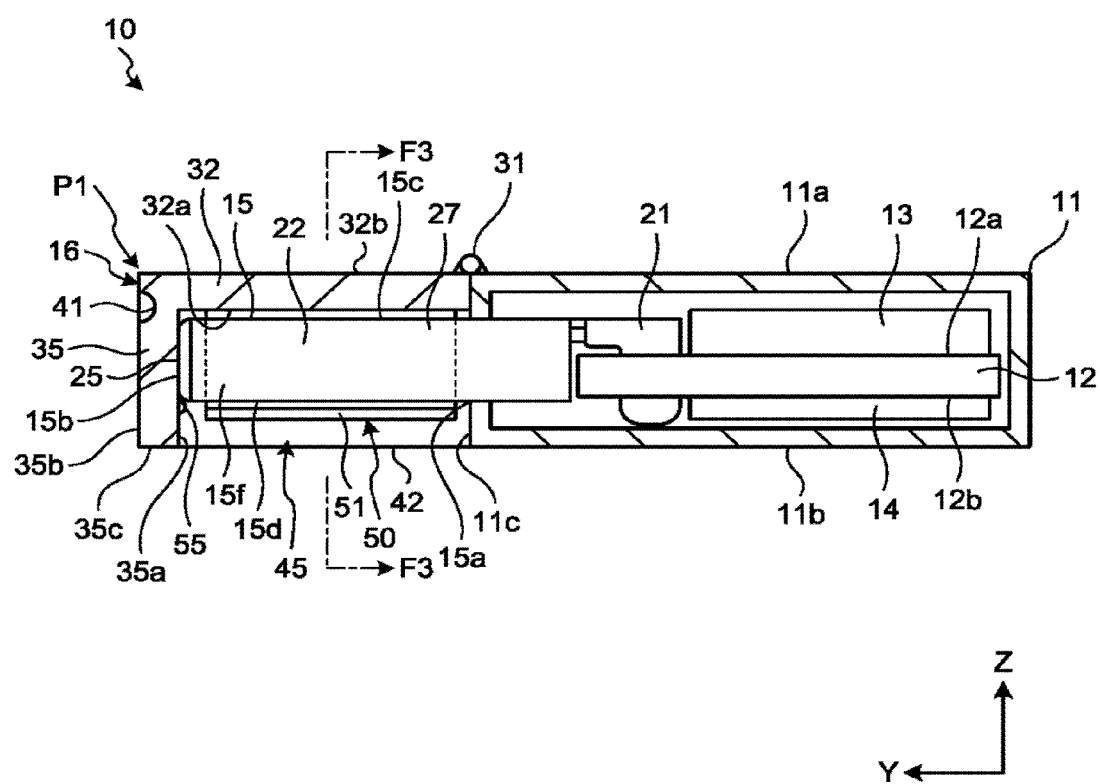
FIG. 2 is a sectional view of the USB drive according to the first embodiment taken along line F2-F2 in FIG. 1.

FIG. 2 is a sectional view of the USB drive 10 according to the first embodiment taken along line F2-F2 in FIG. 1. As illustrated in FIG. 2, the USB drive 10 includes a housing 11, a substrate 12, a flash memory 13, a controller 14, a plug 15, and a cap 16. The flash memory 13 is an example of a non-volatile memory and can also be referred to, for example, as a memory, a storage unit, or an electronic component. The controller 14 can also be referred to, for example, as a control unit or an electronic component. The plug 15 is an example of a connector and USB Type-C male connector, and can also be referred to, for example, as an inserted part or connecting part. The cap 16 is an example of a first cover.

The substrate 12, the flash memory 13, the controller 14, and a portion of the plug 15 are housed inside the housing 11. The housing 11 is made, for example, of synthetic resin or metal. The housing 11 may be made of another material.

The housing 11 is formed in a substantially cubic box shape. The housing 11 includes an upper face 11a, a lower face 11b, and an end face 11c. The upper face 11a is an example of a first face. The lower face 11b is an example of a second face. The end face 11c is an example of a third face and can also be referred to, for example, as an external face, a face, or an end.

The upper face 11a is a substantially flat face facing a positive direction along the Z-axis (direction indicated by the Z-axis arrow). The positive direction along the Z-axis is an example of a first direction. The lower face 11b is a substantially flat face facing a negative direction along the Z-axis (direction opposite to the direction indicated by the Z-axis arrow). The lower face 11b is located on an opposite side of the upper face 11a.

The end face 11c connects an end of the upper face 11a in a positive direction along the Y-axis (direction indicated by the Y-axis arrow) with an end of the lower face 11b in the positive direction along the Y-axis. In other words, the end face 11c is adjacent to each of the upper face 11a and the lower face 11b. The end face 11c is a substantially flat face facing the positive direction along the Y-axis. At least one of the upper face 11a, the lower face 11b, and the end face 11c may be a curved face and may include a protrusion, a recess, a hole, or a cut-out.

The substrate 12 is, for example, a printed circuit board (PCB). The substrate 12 may be another substrate such as a flexible printed wiring circuit board (FPC). The substrate 12 is formed in a substantially quadrilateral (rectangular) plate shape. The substrate 12 may be formed in another shape.

The substrate 12 includes a first mounting face 12a and a second mounting face 12b. The first mounting face 12a is a substantially flat surface of the substrate 12, facing the positive direction along the Z-axis. The second mounting face 12b is a substantially flat surface of the substrate 12, facing the negative direction along the Z-axis. The second mounting face 12b is located on an opposite side of the first mounting face 12a.

The flash memory 13 is mounted on the first mounting face 12a of the substrate 12. The flash memory 13 may be mounted on the second mounting face 12b. The USB flash drive 10 may include a plurality of flash memories 13 mounted on the first mounting face 12a and on the second mounting face 12b.

The controller 14 is mounted on the second mounting face 12b of the substrate 12. The controller 14 may be mounted on the first mounting face 12a. The controller 14 controls the flash memory 13.

The plug 15 is a male connector compliant with the USB Type-C standard. The plug 15 may be another connector connectable to a female connector compliant with the USB Type-C standard. The plug 15 includes a mounting portion 21 and an inserting portion 22.

The mounting portion 21 is mounted on the first mounting face 12a of the substrate 12 by soldering, for example. The mounting portion 21 may be mounted on the second mounting face 12b. The mounting portion 21 is mounted on an end portion of the substrate 12 in the positive direction along the Y-axis. The mounting portion 21 is housed in the housing 11.

The inserting portion 22 extends from the mounting portion 21 in the positive direction along the Y-axis. The inserting portion 22 is formed in a substantially elliptic cylindrical shape. The elliptic shape includes a shape constructed of a rectangle with semicircles at a pair of opposite sides. The inserting portion 22 can be inserted into a USB Type-C female connector. The USB Type-C female connector is an example of an external apparatus.

At least a portion of the inserting portion 22 protrudes from the end face 11c of the housing 11 and is located outside of the housing 11. For example, the inserting portion 22 protrudes to the outside of the housing 11 through a hole that opens at the end face 11c of the housing 11.

The inserting portion 22 includes a first end portion 15a and a second end portion 15b. The first end portion 15a is an end portion of the inserting portion 22 located outside of the housing 11, in the negative direction along the Y-axis (direction opposite to the direction indicated by the Y-axis arrow). The second end portion 15b is an end portion of the inserting portion 22 located outside of the housing 11, in the positive direction along the Y-axis.

The first end portion 15a is connected to the housing 11. In other words, the first end portion 15a is a portion of the inserting portion 22 that is passed through a hole that opens at the end face 11c of the housing 11. The second end portion 15b is located on an opposite side of the first end portion 15a in a direction along the Y-axis. The direction along the Y-axis is an example of a protruding direction from the third face.

Figure 3:
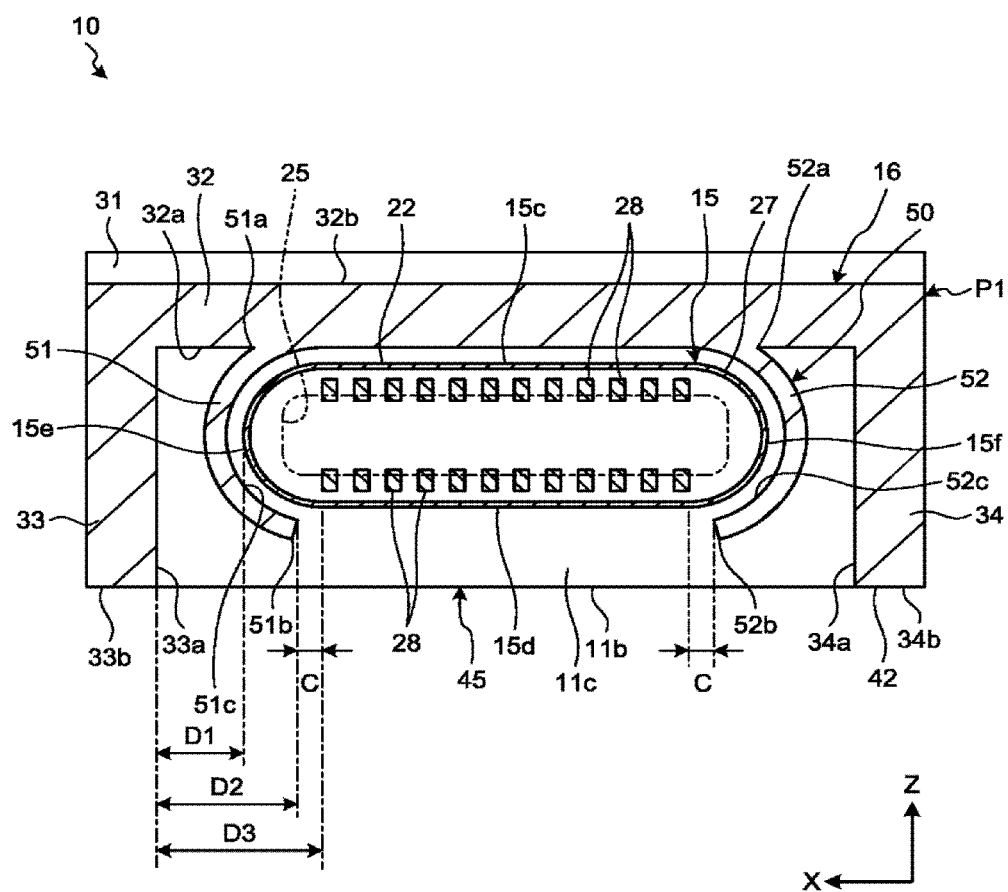
FIG. 3 is a sectional view of the USB drive according to the first embodiment taken along line F3-F3 in FIG. 2.

FIG. 3 is a sectional view of the USB drive 10 according to the first embodiment taken along line F3-F3 in FIG. 2. As illustrated by the two-dot chain line in FIG. 3, an inserting port 25 is provided at the second end portion 15b of the plug 15. The inserting port 25 is an example of a first opening and can also be referred to as a hole, for example. In FIG. 1, the inserting port 25 is illustrated in a broken line.

As illustrated in FIG. 3, the plug 15 includes a first flat face 15c, a second flat face 15d, a first curved face 15e, and a second curved face 15f. The first flat face 15c is an example of a fifth face. The second flat face 15d is an example of a sixth face.

The first flat face 15c is a substantially flat face facing the positive direction along the Z-axis. The second flat face 15d is a substantially flat face facing the negative direction along the Z-axis. The second flat face 15d is located on an opposite side of the first flat face 15c. Each of the first flat face 15c and the second flat face 15d may be, for example, a curved face and may have a protrusion, a recess, a hole, or a cut-out.

The first curved face 15e connects an end of the first flat face 15c in a positive direction along the X-axis (direction indicated by the X-axis arrow) with an end of the second flat face 15d in the positive direction along the X-axis. The first curved face 15e is an arcuate curved face protruding toward the outside of the plug 15. The first curved face 15e may have a curved face that is not arcuate.

The second curved face 15f connects an end of the first flat face 15c in a negative direction along the X-axis (direction opposite to the direction indicated by the X-axis arrow) with an end of the second flat face 15d in the negative direction along the X-axis. The second curved face 15f is an arcuate curved face protruding toward outside of the plug 15. The second curved face 15f may have a curved face that is not arcuate.

The plug 15 further includes a shell 27 and a plurality of terminals 28. The shell 27 is formed in a substantially elliptic cylindrical shape. The shell 27 is made of metal but may be made of another material.

The shell 27 forms the first flat face 15c, the second flat face 15d, the first curved face 15e, and the second curved face 15f, of the plug 15. In other words, the shell 27 forms an external face of the plug 15.

The plurality of terminals 28 is a terminal compliant with the USB Type-C standard. For example, the plug 15 includes twelve terminals 28. The number of terminals 28 may differ from this. One end portion of the terminal 28 is electrically connected to a pad provided on the substrate 12. The other end portion of the terminal 28 is located inside the inserting portion 22. The inserting port 25 of the plug 15 allows at least a portion of the plurality of terminals 28 to be exposed to the outside of the plug 15.

When the inserting portion 22 is connected to the USB Type-C female connector, female connector terminals are inserted into the inserting port 25. The plurality of terminals 28 are electrically connected with the female connector terminals. The inserting port 25 is configured such that the terminals 28 can be connected with the female connectors. With this configuration, the USB drive 10 is electrically connected with an apparatus having the female connector.

As illustrated in FIG. 1, the cap 16 is formed in a substantially cubic box shape. The cap 16 may be formed in another shape. The cap 16 is made, for example, of synthetic resin or metal. The cap 16 may be made of another material.

The cap 16 includes a hinge 31, an upper wall 32, a first side wall 33, a second side wall 34, and a front wall 35. The hinge 31 is an example of a connecting unit. The upper wall 32 is an example of a first wall. The first side wall 33 is an example of a second wall. The second side wall 34 is an example of a third wall. The front wall 35 is an example of a fourth wall.

In the present description, expressions used to indicate directions of upper, lower, left, right, front, rear, and side are described based on FIG. 1 as a reference for explanation. Directions of individual components of the USB drive 10 are not limited by these expressions. For example, the upper wall 32 may be located below another portion of the cap 16. The front wall 35 may be located in the rear of another portion of the cap 16.

The hinge 31 is connected to the upper face 11a of the housing 11. For example, the hinge 31 includes a shaft extending in a direction along the X-axis. The shaft is supported by a protrusion protruding from the upper face 11a of the housing 11. With this configuration, the hinge 31 is connected to the housing 11 pivotably around a first axis Ax1. In other words, the cap 16 is integrated into the housing 11 pivotably around the first axis Ax1. The first axis Ax1 extends in the X-axis direction.

Figure 4:
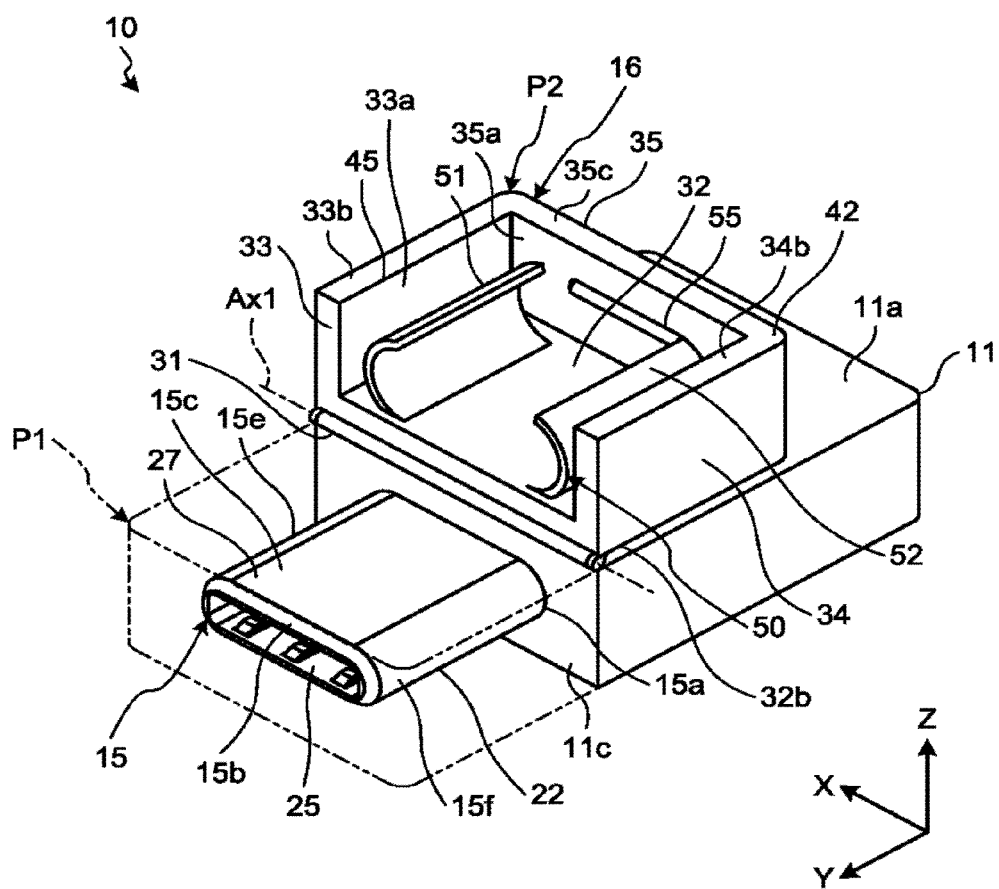
FIG. 4 is a perspective view of the USB drive with a cap pivoted according to the first embodiment.

FIG. 4 is a perspective view of the USB drive 10 with the cap 16 pivoted according to the first embodiment. The cap 16 is pivotable between a first position P1 illustrated in FIG. 1 and a second position P2 illustrated in FIG. 4.

As illustrated in FIG. 1, the cap 16 covers at least a portion of the plug 15 at the first position P1. As illustrated in FIG. 4, the cap 16 is removed from the plug 15 and causes the plug 15 to be exposed at the second position P2. Hereinafter, the cap 16 at the first position P1 will be fundamentally described.

As illustrated in FIG. 2, the upper wall 32 extends from the hinge 31 in the positive direction along the Y-axis. The upper wall 32 is formed in a substantially quadrilateral plate-like shape expanding in an X-Y plane. The upper wall 32 includes an upper internal face 32a and an upper external face 32b. The upper external face 32b is an example of a fourth face.

The upper internal face 32a is a substantially flat face facing the negative direction along the Z-axis. At the first position P1, the upper internal face 32a faces the first flat face 15c of the plug 15. In other words, the first flat face 15c of the plug 15 faces the upper wall 32 when the cap 16 is at the first position P1. When the cap 16 is at the first position P1, the upper external face 32b faces the positive direction along the Z-axis.

As illustrated in FIG. 3, a first side wall 33 protrudes from an end portion of the upper wall 3 in the positive direction along the X-axis, toward the negative direction along the Z-axis. The first side wall 33 is formed in a substantially quadrilateral plate-like shape expanding in a Y-Z plane. The first side wall 33 includes a left internal face 33a. The left internal face 33a is an example of a first internal face.

The left internal face 33a is a substantially flat face facing the negative direction along the X-axis. At the first position P1, the left internal face 33a faces the first curved face 15e of the plug 15. In other words, when the cap 16 is at the first position P1, the first curved face 15e of the plug 15 faces the first side wall 33 and protrudes toward the first side wall 33.

The second side wall 34 protrudes from an end portion of the upper wall 32 in the negative direction along the X-axis toward the negative direction along the Z-axis. The second side wall 34 is formed in a substantially quadrilateral plate-like shape expanding in a Y-Z plane. The second side wall 34 includes a right internal face 34a. The right internal face 34a is an example of a second internal face.

The right internal face 34a is a substantially flat face facing the positive direction along the X-axis. At the first position P1, the right internal face 34a faces the second curved face 15f of the plug 15. In other words, when the cap 16 is at the first position P1, the second curved face 15f of the plug 15 faces the second side wall 34 and protrudes toward the second side wall 34. Furthermore, the right internal face 34a faces the left internal face 33a of the first side wall 33.

As illustrated in FIG. 2, the front wall 35 protrudes from an end portion of the upper wall 32 in the positive direction along the Y-axis toward the negative direction along the Z-axis. The front wall 35 is formed in a substantially quadrilateral plate-like shape expanding in an X-Z plane. The front wall 35 connects an end of the first side wall 33 in the positive direction along the Y-axis with an end of the second side wall 34 in the positive direction along the Y-axis.

The front wall 35 includes a front internal face 35a and a front external face 35b. The front internal face 35a is an example of a third internal face. The front external face 35b is an example of an external face. The front internal face 35a is a substantially flat face facing a negative direction along the Y-axis. At the first position P1, the front internal face 35a faces the second end portion 15b of the plug 15. The front external face 35b is located on an opposite side of the front internal face 35a.

At the first position P1, the front wall 35 covers the inserting port 25 of the plug 15. In other words, the front wall 35 faces the inserting port 25 at the first position P1. At the first position P1, the front internal face 35a comes in contact with the second end portion 15b of the plug 15. At the first position P1, the front internal face 35a may be separated from the second end portion 15b.

A groove 41 is provided on the front external face 35b. The groove 41 is an example of a recess. The groove 41 extends in the direction along the X-axis, in the vicinity of the end of the upper wall 32. The front external face 35b may be provided with a protrusion. The front external face 35b may be provided with a coarse face formed with a plurality of recesses and a plurality of protrusions.

As described above, the plug 15 is housed in the cap 16 at the first position P1. The cap 16 protects the plug 15. As illustrated in FIG. 3, the plug 15 is located between the first side wall 33 and the second side wall 34 in the direction along the X-axis. As illustrated in FIG. 2, the plug 15 is located between the front wall 35 and the housing 11 in the direction along the Y-axis.

As illustrated in FIG. 3, the first e wall 33 includes a lower end portion 33b. The lower end portion 33b is an example of an edge portion. The lower end portion 33b is an end portion of the first side wall 33 in the negative direction along the Z-axis. In other words, the lower end portion 33b is an end portion of the first side wall 33 located on an opposite side of the upper wall 32. The second flat face 15d of the plug 15 is closer to the upper wall 32 than to the lower end portion 33b, at the first position P1.

The second side wall 34 includes a lower end portion 34b. The lower end portion 34b is an end portion of the second side wall 34 in the negative direction along the Z-axis. In other words, the lower end portion 34b is an end portion of the second side wall 34 located on the opposite side of the upper wall 32. The second flat face 15d of the plug 15 is closer to the upper wall 32 than to the lower end portion 34b, at the first position P1.

As illustrated in FIG. 2, the front wall 35 includes a lower end portion 35c. The lower end portion 35c is an end portion of the front wall 35 in the negative direction along the Z-axis. In other words, the lower end portion 35c is an end portion of the front wall 35 located on the opposite side of the upper wall 32. The second flat face 15d of the plug 15 is closer to the upper wall 32 than to the lower end portion 35c, at the first position P1.

The lower end portions 33b, 34b, and 35c of the first side wall 33, the second side wall 34, and the front wall 35 form an edge portion 42. In other words, the edge portion 42 includes the lower end portions 33b, 34b, and 35c of the first side wall 33, the second side wall 34, and the front wall 35. The edge portion 42 has substantially a U-shaped form. At the first position P1, the plug 15 is located between the upper wall 32 and the edge portion 42, in the direction along the Z-axis.

The edge portion 42 of the cap 16 forms an opening 45. The opening 45 is an example of a second opening. The opening 45 is a cut-out formed by the first side wall 33, the second side wall 34, and the front wall 35. The opening 45 is not limited to this.

At the first position P1, the opening 45 is surrounded by the first side wall 33, the second side wall 34, the front wall 35, and the end face 11c of the housing 11. At the first position P1, the opening 45 opens at the edge portion 42 in the negative direction along the Z-axis. The negative direction along the Z-axis is an example of a direction the sixth face faces.

At the first position P1, the opening 45 houses the plug 15 and causes a portion of the housed plug 15 to be exposed. For example, the second flat face 15d of the plug 15 can be observed from outside of the cap 16 through the opening 45. However, the first flat face 15c of the plug 15 is covered by the cap 16, and thus, is not observed from outside of the cap 16. A portion of the first flat face 15c of the plug 15 may be observable from outside of the cap 16.

The cap 16 pivots from the first position P1 to the second position P2 relative to the plug 15. When the cap 16 and the plug 15 pivot relative to each other, the plug 15 passes through the opening 45. Furthermore, when the cap 16 pivots from the second position P2 to the first position P1, the plug 15 passes through the opening 45.

As illustrated in FIG. 3, a first stopper 50 is provided at the cap 16. The first stopper 50 includes a first hook 51 and a second hook 52. The first stopper 50 may include one of the first hook 51 and the second hook 52. The first stopper 50 can also be referred to as a holder, a fitting unit, a locking unit, a recess, or a spring, for example.

The first hook 51 and the second hook 52 are located between the first side wall 33 and the second side wall 34 in the direction along the X-axis. At the first position P1, at least a portion of the first hook 51 is located between the first side wall 33 and the plug 15. At the first position P1, at least a portion of the second hook 52 is located between the second side wall 34 and the plug 15. In other words, at the first position P1, the plug 15 is located between the first hook 51 and the second hook 52.

The first hook 51 protrudes from the upper internal face 32a of the upper wall 32. The first hook 51 is an arcuate plate curved toward the first side wall 33 and extends in the direction along the Y-axis. The first hook 51 may be formed in another shape. The first hook 51 is separated from the first side wall 33. The first hook 51 may come in contact with the first side wall 33.

The first hook 51 includes a first proximal end portion 51a and a first distal end portion 51b. The first proximal end portion 51a is an example of a proximal end portion. The first distal end portion 51b is an example of a distal end portion and an example of a distal end portion of the first stopper. The first proximal end portion 51a is connected to the upper internal face 32a of the upper wall 32. The first distal end portion 51b is located on an opposite side of the first proximal end portion 51a. In other words, the first distal end portion 51b is separated from the upper wall 32.

The first hook 51 with an arcuate shape includes a first internal face 51c. The first internal face 51c is an example of a third curved face. The first internal face 51c faces the first curved face 15e of the plug 15 at the first position P1. The first internal face 51c is a curved face recessed in a direction where the first curved face 15e protrudes. In other words, the first internal face 51c is a curved face recessed so as to be separated from the plug 15. A radius of curvature of the first internal face 51c is substantially equal to a radius of curvature of the first curved face 15e. The radius of curvature of the first internal face 51c may differ from the radius of curvature of the first curved face 15e.

The first hook 51 is hooked on the first curved face 15e of the plug 15 at the first position P1 so as to hold the cap 16 onto the plug 15. Specifically, at the first position P1, a portion of the first curved face 15e (lower half) that is closer to the second flat face 15d rather than to the first flat face 15c faces the first hook 51. In other words, in the direction along the Z-axis, a portion of the plug 15 is located between the upper wall 32 and the first distal end portion 51b of the first hook 51 when the cap 16 is at the first position P1. When the cap 16 pivots from the first position P1 to the second position P2, the first hook 51 comes in contact with a lower half of the first curved face 15e. With this configuration, the first hook 51 holds the cap 16 onto the plug 15 and thus prevents the cap 16 from pivoting from the first position P1 toward the second position P2.

At the first position P1, the first hook 51 may be separated from the plug 15. However, when the cap 16 slightly pivots from the first position P1 toward the second position P2, the first hook 51 comes in contact with the lower half of the first curved face 15e.

At the first position P1, in a plan view of the second flat face 15d of the plug 15, the first distal end portion 51b of the first hook 51 is located outside of the second flat face 15d and overlaps with the first curved face 15e. In other words, as indicated by the one-dot chain line in FIG. 3, the first distal end portion 51b of the first hook 51 is separated from the second flat face 15d via a space C in the direction along the X-axis. In a plan view of the second flat face 15d of the plug 15, the first distal end portion 51b of the first hook 51 at the first position P1 may overlap with the second flat face 15d.

In a plan view in the direction along the Z-axis as in FIG. 3, a distance D1 between the first side wall 33 and a point on the first curved face 15e closest to the first side wall 33 is shorter than a distance D2 between the first distal end portion 51b of the first hook 51 and the first side wall 33. Furthermore, in a plan view in the direction along the Z-axis, the distance D2 between the first distal end portion 51b of the first hook 51 and the first side wall 33 is shorter than a distance D3 between a point connecting the first curved face 15e with the second flat face 15d and the first side wall 33.

When the cap 16 is pivoted from the first position P1 to the second position P2, the first hook 51 is pressed by the plug 15. A tensile modulus of the first hook 51 is lower than a tensile modulus of the shell 27 of the plug 15. Therefore, when a force acting from the first hook 51 onto the plug 15 is increased, the first hook 51 elastically deforms.

The first hook 51 elastically deforms in a direction that is a pivoting axial direction of the cap 16 and that is a separating direction from the plug 15. In other words, the first hook 51 elastically deforms so as to be separated from the second hook 52 and to approach the first side wall 33. The pivoting axial direction of the cap 16 is a direction where the first axis Ax1 extends.

The first hook 51 elastically deforms into a shape that allows the cap 16 to pivot from the first position P1 toward the second position P2. For example, the first distal end portion 51b of the first hook 51 comes in contact with the lower half of the first curved face 15e at the first position P1. When the first hook 51 elastically deforms, the first distal end portion 51b approaches a portion of the first curved face 15e (upper half) that is closer to the first flat face 15c rather than to the second flat face 15d. Subsequently, the first hook 51 elastically deforms into a shape that causes the first distal end portion 51b to come in contact with an upper half of the first curved face 15e. At this time, the first hook 51 allows the cap 16 to pivot from the first position P1 toward the second position P2.

When the cap 16 further pivots, the first hook 51 is separated from the plug 15, so as to remove a force acting from the first hook 51 onto the plug 15. Accordingly, the first hook 51 returns to its original shape. At this time, the plug 15 moves to the outside from a space between the upper wall 32 and the first distal end portion 51b of the first hock 51.

When the cap 16 pivots from the second position P2 toward the first position P1, the first distal end portion 51b of the first hook 51 comes in contact with the first curved face 15e of the plug 15. When the cap 16 further pivots, the first hook 51 is pressed by the plug 15. When the force acting from the first hook 51 onto the plug 15 is increased, the first hook 51 elastically deforms in the direction that is the pivoting axial direction of the cap 16 and that is the separating direction from the plug 15.

The first hook 51 elastically deforms into a shape that allows the cap 16 to pivot from the second position P2 toward the first position P1. For example, the first distal end portion Sib of the first hook 51 comes in contact with the upper half of the first curved face 15e. When the first hook 51 elastically deforms, the first distal end portion 51b approaches the lower half of the first curved face 15e. Subsequently, the first hook 51 elastically deforms into a shape that causes the first distal end portion 51b to come in contact with the lower half of the first curved fame 15e. At this time, the first hook 51 holds the cap 16 onto the plug 15.

The second hook 52 protrudes from the upper internal face 32a of the upper wall 32. The second hook 52 is an arcuate plate curved toward the second side wall 34 and extends in the direction along the Y-axis. The second hook 52 may be formed in another shape. The second hook 52 is separated from the second side wall 34. The second hook 52 may come in contact with the second side wall 34.

The second hook 52 includes a second proximal end portion 52a and a second distal end portion 52b. The second proximal end portion 52a is an example of a proximal end portion. The second distal end portion 52b is an example of a distal end portion ant an example of a distal end portion of the first stopper. The second proximal end portion 52a is connected to the upper internal face 32a of the upper wall 32. The second distal end portion 52b is located on an opposite side of the second proximal end portion 52a. In other words, the second distal end portion 52b is separated from the upper wall 32.

The second hook 52 with an arcuate shape includes a second internal face 52c. The second internal face 52c faces the second curved face 15f of the plug 15 at the first position P1. The second internal face 52c is a curved face recessed in a direction where the second curved face 15f protrudes. In other words, the second internal face 52c is a curved face recessed so as to be separated from the plug 15. A radius of curvature of the second internal face 52c is substantially equal to a radius of curvature of the second curved face 15f. The radius of curvature of the second internal face 52c may differ from the radius of curvature of the second curved face 15f.

The second hook 52 is hooked on the second curved face 15f of the plug 15 so as to hold the cap 16 onto the plug 15, at the first position P1. Specifically, at the first position P1, a portion of the second curved face 15f (lower half) that is closer to the second flat face 15d rather than to the first flat face 15c faces the second hook 52. In other words, in the direction along the Z-axis, a portion of the plug 15 is located between the upper wall 32 and the second distal end portion 52b of the second hook 52 when the cap 16 is at the first position P1. When the cap 16 pivots from the first position P1 to the second position P2, the second hook 52 comes in contact with a lower half of the second curved face 15f. With this configuration, the second hook 52 holds the cap 16 onto the plug 15 and thus prevents the cap 16 from pivoting from the first position P1 toward the second position P2.

At the first position P1, the second hook 52 may be separated from the plug 15. However, when the cap 16 slightly pivots from the first position P1 toward the second position P2, the second hook 52 comes in contact with the lower half of the second curved face 15f.

At the first position P1, in a plan view of the second flat face 15d of the plug 15, the second distal end portion 52b of the second hook 52 is located outside of the second flat face 15d and overlaps with the second curved face 15f. In other words, as indicated by the one-dot chain line in FIG. 3, the second distal end portion 52b of the second hook 52 is separated from the second flat face 15d via a space C in the direction along the X-axis. In a plan view of the second flat face 15d of the plug 15, the second distal end portion 52b of the second hook 52 at the first position P1 may overlap with the second flat face 15d.

When the cap 16 is pivoted from the first position P1 to the second position P2, the second hook 52 is pressed by the plug 15. A tensile modulus of the second hook 52 is lower than a tensile modulus of the shell 27 of the plug 15. Therefore, when a force acting from the second hook 52 onto the plug 15 is increased, the second hook 52 elastically deforms.

The second hook 52 elastically deforms in the direction that is the pivoting axial direction of the cap 16 and that is the separating direction from the plug 15. In other words, the second hook 52 elastically deforms so as to be separated from the first hook 51 and to approach the second side wall 34.

The second hook 52 elastically deforms into a shape that allows the cap 16 to pivot from the first position P1 toward the second position P2. For example, the second distal end portion 52b of the second hook 52 comes in contact with the lower half of the second curved face 15f, at the first position P1. When the second hook 52 elastically deforms, the second distal end portion 52b approaches a portion of the second curved face 15f (upper half) that is closer to the first flat face 15c rather than to the second flat face 15d. Subsequently, the second hook 52 elastically deforms into a shape that causes the second distal end portion 52b to come in contact with an upper half of the second curved face 15f. At this time, the second hook 52 allows the cap 16 to pivot from the first position P1 toward the second position P2.

When the cap 16 further pivots, the second hook 52 is separated from the plug 15, so as to remove a force acting from the second hook 52 onto the plug 15. Accordingly, the second hook 52 returns to its original shape. At this time, the plug 15 moves to the outside from a space between the upper wall 32 and the second distal end portion 52b of the second hook 52.

When the cap 16 pivots from the second position P2 toward the first position P1, the second distal end portion 52b of the second hook 52 comes in contact with the second curved face 15f of the plug 15. When the cap 16 further pivots, the second hook 52 is pressed by the plug 15. When the force acting from the second hook 52 onto the plug 15 is increased, the second hook 52 elastically deforms in the direction that is the pivoting axial direction of the cap 16 and that is the separating direction from the plug 15.

The second hook 52 elastically deforms into a shape that allows the cap 16 to pivot from the second position P2 toward the first position P1. For example, the second distal end portion 52b of the second hook 52 comes in contact with an upper half of the second curved face 15f. When the second hook 52 elastically deforms, the second distal end portion 52b approaches the lower half of the second curved face 15f. Subsequently, the second hook 52 elastically deforms into a shape that causes the second distal end portion 52b to come in contact with the lower half of the second curved face 15f. At this time, the second hook 52 holds the cap 16 onto the plug 15.

As illustrated in FIG. 2, a second stopper 55 is provided at the cap 16. The second stopper 55 can also be referred to, for example, as a holder, a fitting unit, a locking unit, or a spring. The second stopper 55 is a protrusion protruding from the front internal face 35a of the front wall 35. The second stopper 55 extends, for example, in the direction along the X-axis. A portion of the plug 15 is located between the upper wall 32 and the second stopper 55 at the first position P1.

At the first position P1, the second stopper 55 is hooked on a corner portion between the second end portion 15b and the second flat face 15d of the plug 15 so as to hold the cap 16 onto the plug 15. Specifically, when the cap 16 pivots from the first position P1 to the second position P2, the second stopper 55 comes in contact with the corner portion between the second end portion 15b and the second flat face 15d. With this configuration, the second stopper 55 holds the cap 16 onto the plug 15 and thus prevents the cap 16 from pivoting from the first position P1 toward the second position P2.

When the cap 16 is pivoted from the first position P1 to the second position P2, the second stopper 55 is pressed by the plug 15. A tensile modulus of the second stopper 55 is lower than a tensile modulus of the shell 27 of the plug 15. Therefore, when a force acting from the second stopper 55 onto the plug 15 is increased, the second stopper 55 elastically deforms. The second stopper 55 elastically deforms so as to be separated from the second end portion 15b of the plug 15.

The second stopper 55 elastically deforms into a shape that allows the cap 16 to pivot from the first position P1 toward the second position P2. For example, the second stopper 55 comes in contact with the corner portion between the second end portion 15b and the second flat face 15d, at the first position P1. When the second stopper 55 elastically deforms, the corner portion between the second end portion 15b and the second flat face 15d gets over the second stopper 55. At this time, the second stopper 55 allows the cap 16 to pivot from the first position P1 toward the second position P2.

When the cap 16 further pivots, the second stopper 55 is separated from the plug 15, so as to remove a force acting from the second stopper 55 onto the plug 15. Accordingly, the second stopper 55 returns to its original shape. At this time, the plug 15 moves to the outside from a space between the upper wall 32 and the second stopper 55.

When the cap 16 pivots from the second position P2 toward the first position P1, the second stopper 55 comes in contact with the corner portion between the second end portion 15b and the second flat face 15d of the plug 15. When the cap 16 further pivots, the second stopper 55 is pressed by the plug 15. When a force acting from the second stopper 55 onto the plug 15 is increased, the second stopper 55 elastically deforms.

The second stopper 55 elastically deforms into a shape that allows the cap 16 to pivot from the second position P2 toward the first position P1. For example, the second stopper 55 comes in contact with the corner portion between the second end portion 15b and the second flat face 15d. When the second stopper 55 elastically deforms, the corner portion between the second end portion 15b and the second flat face 15d gets over the second stopper 55. At this time, the second stopper 55 holds the cap 16 onto the plug 15.

As described above, the cap 16 is pivotable from the first position P1 to the second position P2. At the second position P2, the cap 16 causes the plug 15 to be exposed, and the upper external face 32b of the upper wall 32 faces the upper face 11a of the housing 11. The exposed inserting portion 22 of the plug 15 can be inserted into the USB Type-C female connector.

Figure 5:
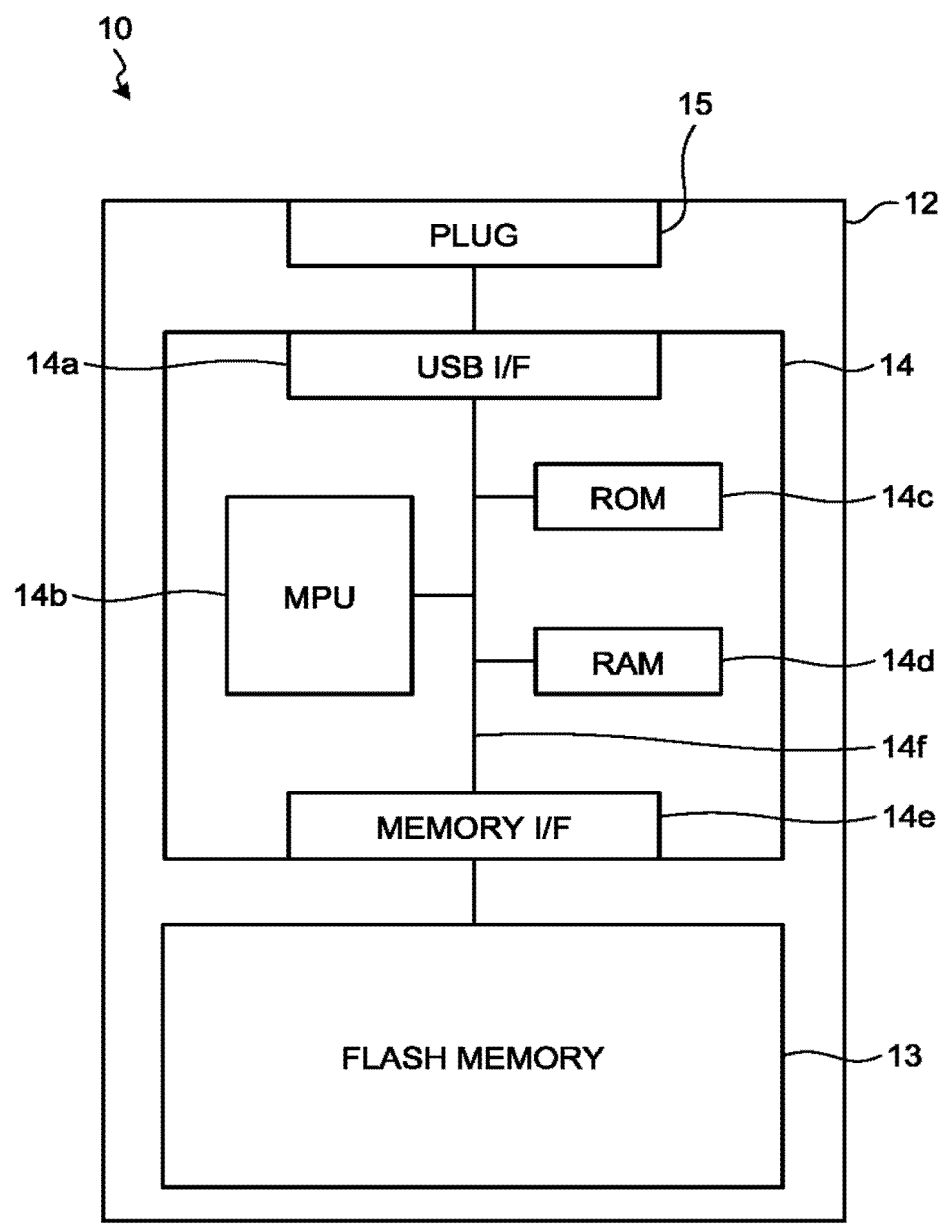
FIG. 5 is a block diagram illustrating an exemplary configuration of the USB drive according to the first embodiment.

FIG. 5 is a block diagram illustrating an exemplary configuration of the USB drive 10 according to the first embodiment. As illustrated in FIG. 5, the controller 14 controls transmission of data between the plug 15 and the flash memory 13. The controller 14 includes a USB interface (I/F) 14a, an MPU 14b, a ROM 14c, a RAM 14d, a memory interface (I/F) 14e, and an internal bus 14f. The USB I/F 14a, the MPU 14b, the ROM 14c, the RAM 14d, the memory I/F 14e, and the internal bus 14f are formed, for example, on one semiconductor substrate.

The USB I/F 14a receives data and commands from a host apparatus via the plug 15. The data and commands are described, for example, based on the small computer system interface (SCSI) standard format. The USB I/F 14a outputs data read from the flash memory 13 to the host apparatus via the plug 15 based on the SCSI standard format.

The MPU 14b processes commands received from the host apparatus and data received from the flash memory 13 using, for example, the ROM 14c and the RAM 14d. Furthermore, when the USB drive 10 is connected to the host apparatus, the MPU 14b executes authentication processing between the host apparatus and the USB drive 10.

The ROM 14c holds data and programs needed for processing on the MPU 14b. The RAM 14d functions as a working area for processing of the MPU 14b. The RAM 14d is, for example, a volatile semiconductor memory such as a DRAM.

The memory I/F 14e is connected to the flash memory 13 by a plurality of wires, for example. The memory I/F 14e, according to instructions from the MPU 14b, transfers command and data received by the USB I/F 14a to the flash memory 13, and transfers data read from the flash memory 13 to the USB I/F 14a.

The flash memory 13 reads out and outputs data according to a read command provided from the controller 14. The flash memory 13 records data according to a write command provided from the controller 14.

At the USB drive 10 according to the first embodiment, the cap 16 is connected to the housing 11 and pivotable between the first position P1 and the second position P2. At the first position P1, the upper external face 32b faces the positive direction along the Z-axis. At the second position P2, the upper external face 32b faces the upper face 11a of the housing 11. When the cap 16 pivots from the first position P1 to the second position P2, the first stopper 50 of the cap 16 comes in contact with the plug 15 and is elastically deformable in the direction that is the pivoting axial direction of the cap 16 and that is the separating direction from the plug 15. This configuration suppresses accidentally pivoting of the cap 16 from the first position P1 to the second position P2. Furthermore, the cap 16 easily moves from the first position P1, at which the plug 15 is protected, to the second position P2 at which the plug 15 is exposed. The state in which the cap 16 is connected to the housing 11 suppresses loss of the cap 16.

The upper wall 32 extends from the hinge 31 connected to the housing 11. The first stopper 50 protrudes from the upper wall 32 configured to pivot. This configuration makes it possible to simplify the cap 16 without a need to include a complicated form for providing the first topper 50.

In the direction along the Z-axis, the plug 15 is located between the upper wall 32 and the first and second distal end portions 51b and 52b of the first stopper 50 when the cap 16 is at the first position P1. With this configuration, when the upper wall 32 of the cap 16 is going to pivot so as to be separated from the plug 15, the first stopper 50 can hold the cap 16 onto the plug 15.

The first stopper 50 is located between the first side wall 33 and the second side wall 34. In other words, the first side wall 33 and the second side wall 34 cover the plug 15 and the first stopper 50. This configuration suppresses that the plug 15 and the first stopper 50 are damaged.

The first stopper 50 is configured to come in contact with at least one of the first curved face 15e and the second curved face 15f when the cap 16 pivots from the first position P1 to the second position P2. The first hook 51 and the second hook 52 of the first stopper 50 elastically deform by being pressed by the first curved face 15e and the second curved face 15f. Therefore, the first stopper 50 is likely to elastically deform into a shape that allows the cap 16 to pivot from the first position P1 toward the second position P2.

At the first position P1, the front wall 35 faces the inserting port 25 configured to allow the terminal 28 of the plug 15 to be connected with an external apparatus such as a female connector. This configuration suppresses that the terminal 28 of the plug 15 is damaged.

When the cap 16 pivots from the first position P1 to the second position P2, the second stopper 55 that protrudes from the front wall 35 comes in contact with the plug 15 and elastically deforms so as to be separated from the second end portion 15b of the plug 15. This configuration suppresses accidentally pivoting of the cap 16 from the first position P1 to the second position P2 more reliably.

The first hook 51 is separated from the first side wall 33. This configuration suppresses hindrance of elastic deformation of the first hook 51 by the first side wall 33.

When the cap 16 moves from the second position P2 to the first position P1, the first curved face 15e presses the first distal end portion 51b of the first hook 51. In the present embodiment, at the first position P1, the first distal end portion 51b of the first hook 51 is located outside of the second flat face 15d in a plan view of the second flat face 15d. This configuration causes the first hook 51 to elastically deform into a shape that allows the cap 16 to pivot from the second position P2 toward the first position P1. In other words, the first hook 51 is opened by the first curved face 15e, so as to enable the cap 16 to return to the first position P1.

When the cap 16 pivots from the first position P1 to the second position P2, the first hook 51 comes in contact with the first curved face 15e and the second hook 52 comes in contact with the second curved face 15f. This configuration suppresses accidentally pivoting of the cap 16 from the first position P1 to the second position P2.

The second flat face 15d of the plug 15 is closer to the upper wall 32 than to the lower end portion 33b of the first side wall 33, at the first position P1. When an external object approaches the plug 15, the object comes in contact with the lower end portion 33b but does not likely to come in contact with the plug 15. This configuration suppresses that the plug 15 is damaged.

The first stopper 50 includes the first internal face 51c that is configured to face the first curved face 15e at the first position P1 and that is recessed in a direction where the first curved face 15e protrudes. In other words, the first stopper 50 has a shape that corresponds to the first curved face 15e. With this configuration, the first stopper 50 can hold the cap 16 that is at the first position P1 onto the plug 15 more reliably.

The groove 41 is provided on the front external face 35b of the front wall 35. A user can easily pivots the cap 16 from the first position P1 to the second position P2 by hooking a finger on the groove 41. There may be provided, on the front external face 35b the front wall 35, a protrusion on which the user can hook one's finger.

The cap 16 forms the opening 45 that houses the plug 15 and that opens in the direction the second flat face 15d faces at the first position P1. This configuration allows the cap 16 to protect the plug 15 and reduces material cost of the cap 16.

A tensile modulus of the first stopper 50 is lower than a tensile modulus of the plug 15. This enables the first stopper 50 to elastically deform easily into a shape that allows the cap 16 to pivot from the first position P1 toward the second position P2.

The plug 15 is a USB Type-C male connector. A USB Type-C male connector is smaller than, for example, a USB Type-A male connector. Therefore, it may be likely that the cap 16 covering the plug 15 is small and easily lost. The cap 16 of the present embodiment, however, is connected to the housing 11, and thus, loss of the cap 16 is suppressed.

The cap 16 covers at least a portion of the plug 15, at the first position P1. This configuration suppresses accidental transmission of an electrical signal to the flash memory 13 and the controller 14 via the terminal 28 and suppresses damage of data stored in the flash memory 13.

Second Embodiment

Hereinafter, a second embodiment will be described with reference to FIG. 6. Note that in the following plurality of embodiments, for components with functions similar to the functions of the already-described components, a same sign as of the already-described components will be given and description for these will be omitted in some cases. A plurality of components with a same sign does not always have a same function or property but may have a different function and property according to each of the embodiments.

Figure 6:
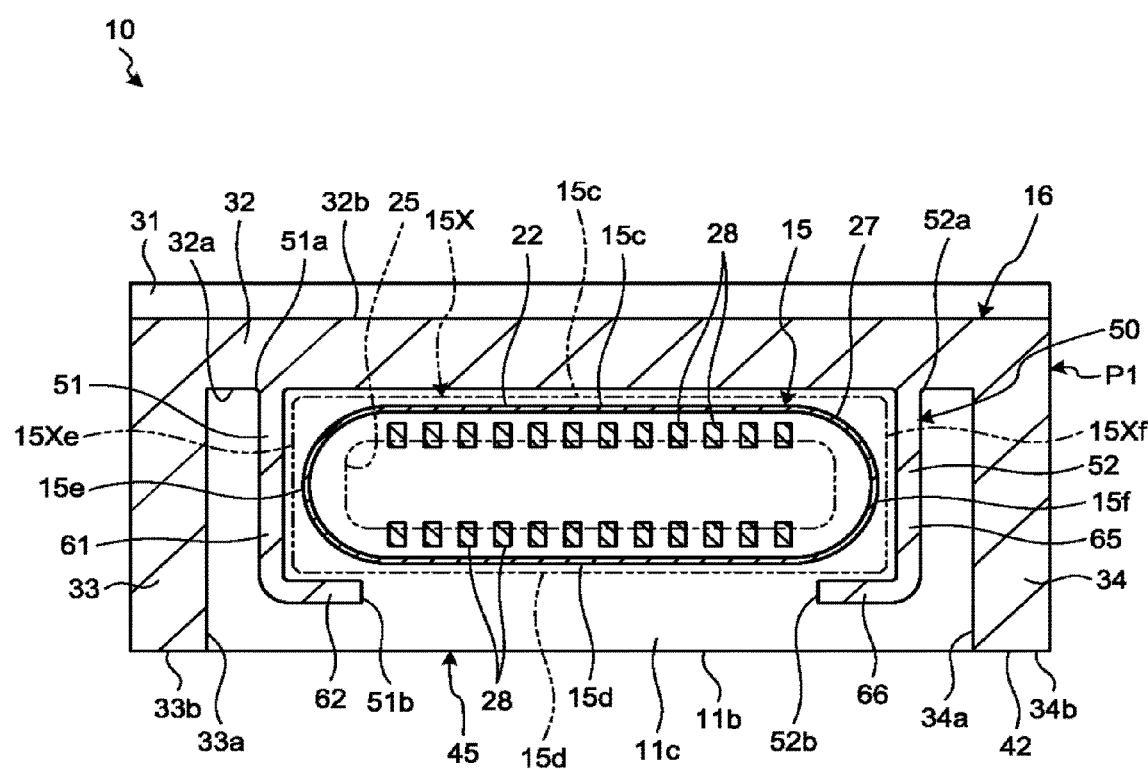
FIG. 6 is a sectional view of a USB drive according to a second embodiment.

FIG. 6 is a sectional view of the USB drive 10 according to the second embodiment. As illustrated in FIG. 6, the first hook 51 according to the second embodiment is formed in a substantially L-shape. The first hook 51 includes a first extending portion 61 and a first protruding portion 62.

The first extending portion 61 extends from the upper internal face 32a of the upper wall 32 in the negative direction along the Z-axis. The first protruding portion 62 extends from an end portion of the first extending portion 61 in the negative direction along the Z-axis, to the negative direction along the X-axis. In other words, the first protruding portion 62 extends toward the second hook 52.

The second hook 52 according to the second embodiment is formed in a substantially L-shape. The second hook 52 includes a second extending portion 65 and a second protruding portion 66. The second extending portion 65 extends from the upper internal face 32a of the upper wall 32 in the negative direction along the Z-axis. The second protruding portion 66 extends from an end portion of the second extending portion 65 in the negative direction along the Z-axis toward the positive direction along the X-axis. In other words, the second protruding portion 66 extends toward the first hook 51.

Similarly to the first embodiment, in a plan view of the second flat face 15d of the plug 15, the first distal end portion 51b of the first hook 51 at the first position P1 is located outside of the second flat face 15d and overlaps with the first curved face 15e. In a plan view of the second flat face 15d of the plug 15, the second distal end portion 52b of the second hook 52 at the first position P1 is located outside of the second flat face 15d and overlaps with the second curved face 15f.

Similarly to the first embodiment, the first hook 51 and the second hook 52 hold the cap 16 that is at the first position P1 onto the plug 15. Each of the first hook 51 and the second hook 52 elastically deforms into a shape that allows the cap 16 to pivot from the first position P1 toward the second position P2.

The first hook 51 and the second hook 52 according to the second embodiment can hold not only the plug 15 but also another plug 15X, onto the cap 16. The other plug 15X is an example of a connector. FIG. 6 virtually illustrates the other plug 15X with the two-dot chain line.

The other plug 15X is formed in a substantially quadrilateral cylindrical shape. The other plug 15X is, for example, a USB Type-A male connector. The first hook 51 and the second hook 52 according to the second embodiment may hold another connector such as an HDMI male connector. Furthermore, the first hook 51 and the second hook 52 according to the first embodiment may hold a USB Type-A male connector.

Similarly to the plug 15, the other plug 15X includes the first end portion 15a, the second end portion 15b, the first flat face 15c, and the second flat face 15d. The other plug 15X further includes a first side face 15Xe and a second side face 15Xf.

The first side face 15Xe connects an end of the first flat face 15c in the positive direction along the X-axis and an end of the second flat face 15d in the positive direction along the X-axis. The first side face 15Xe extends in the direction along the Z-axis and faces the positive direction along the X-axis.

The second side face 15Xf connects an end of the first flat face 15c in the negative direction along the X-axis and an end of the second flat face 15d in the negative direction along the X-axis. The second side face 15Xf extends in the direction along the Z-axis and faces the negative direction along the X-axis.

In a plan view of the second flat face 15d of the other plug 15X, the first distal end portion 51b of the first hook 51 at the first position P1 overlaps with the second flat face 15d. In a plan view of the second flat face 15d of the other plug 15X, the second distal end portion 52b of the second hook 52 at the first position P1 overlaps with the second flat face 15d.

The first hook 51 and the second hook 52 hold the cap 16 that is at the first position P1 onto the other plug 15X. Subsequently, each of the first hook 51 and the second hook 52 is elastically deformed into a shape that allows the cap 16 to pivot from the first position P1 toward the second position P2 by the plug 15X.

According to the second embodiment described above, the first stopper 50 can hold not only the plug 15 that is formed in a substantially elliptic cylindrical shape but also the plug 15X that is formed in a substantially quadrilateral cylindrical shape onto the cap 16 that is at the first position P1. Furthermore, when the cap 16 pivots from the first position P1 to the second position P2, the first stopper 50 elastically deforms into a shape that allows the cap 16 to pivot from the first position P1 toward the second position P2.

Third Embodiment

Figure 7:
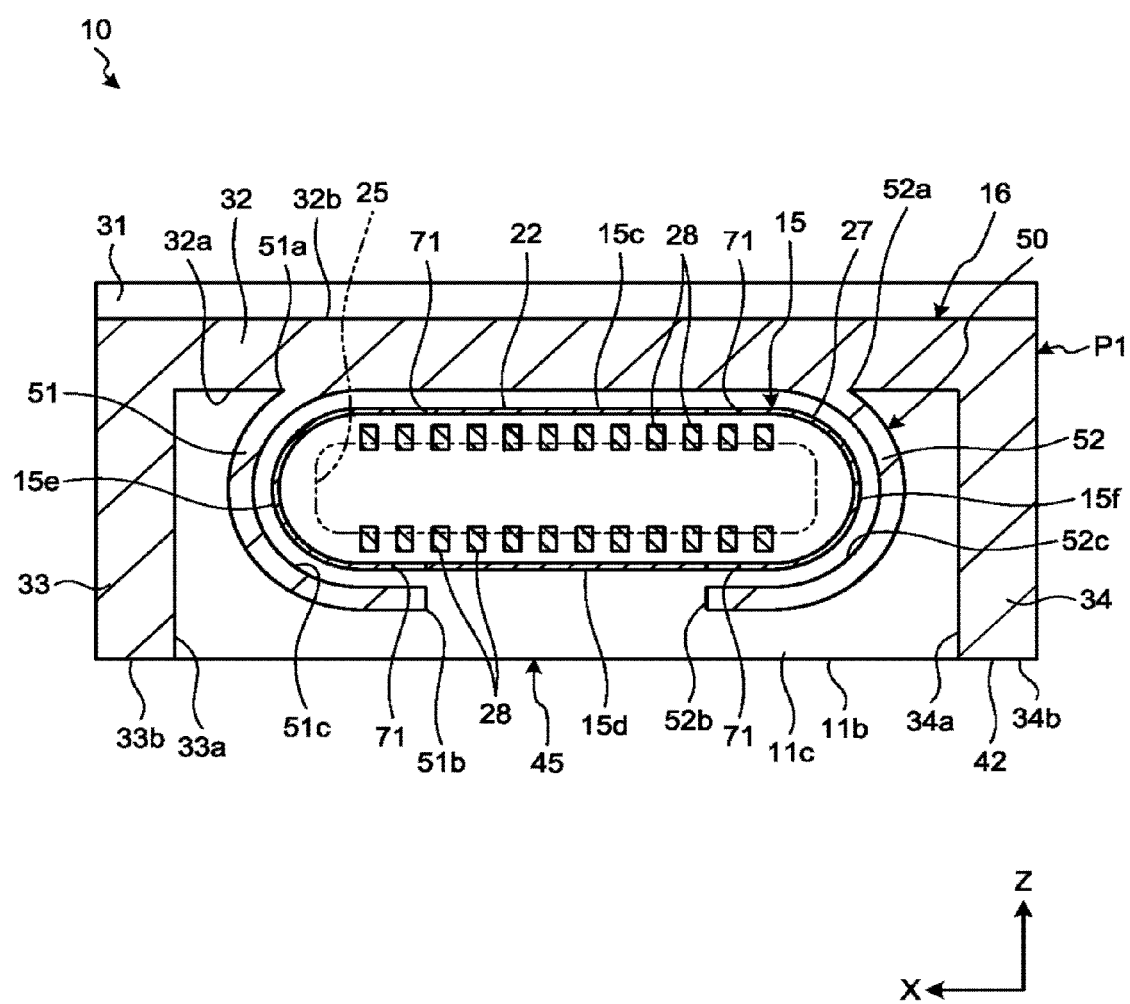
FIG. 7 is a sectional view of a USB drive according to a third embodiment.

Hereinafter, a third embodiment will be described with reference to FIG. 7. FIG. 7 is a sectional view of the USB drive 10 according to the third embodiment. As illustrated in FIG. 7, a plurality of holes 71 is provided at the shell 27 of the plug 15.

The hole 71 opens at the first flat face 15c and at the second flat face 15d, of the plug 15. When the inserting portion 22 of the plug 15 is inserted into a female connector, a leaf spring of the female connector, for example, is inserted into the hole 71. This configuration fixes the plug 15 into the female connector.

According to the third embodiment, in a plan view of the second flat face 15d of the plug 15, the first distal end portion 51b of the first hook 51 at the first position P1 overlaps with the second flat face 15d. In a plan view of the second flat face 15d of the plug 15, the second distal end portion 52b of the second hook 52 at the first position P1 overlaps with the second flat face 15d.

The hole 71 that opens at the first flat face 15c is covered with the upper wall 32 of the cap 16 that is at the first position P1. At the first position P1, the first hook 51 and the second hook 52, of the first stopper 50, cover the hole 71 that opens at the second flat face 15d. When the cap 16 is at the first position P1, at least one of the holes 71 may be exposed.

On the USB drive 10 according to the third embodiment, the first hook 51 and the second hook 52, of the first stopper 50, cover the hole 71 of the second flat face 15d of the plug 15, at the first position P1. This configuration suppresses penetration of dust and water into the plug 15 through the hole 71.

Fourth Embodiment

Figure 8:
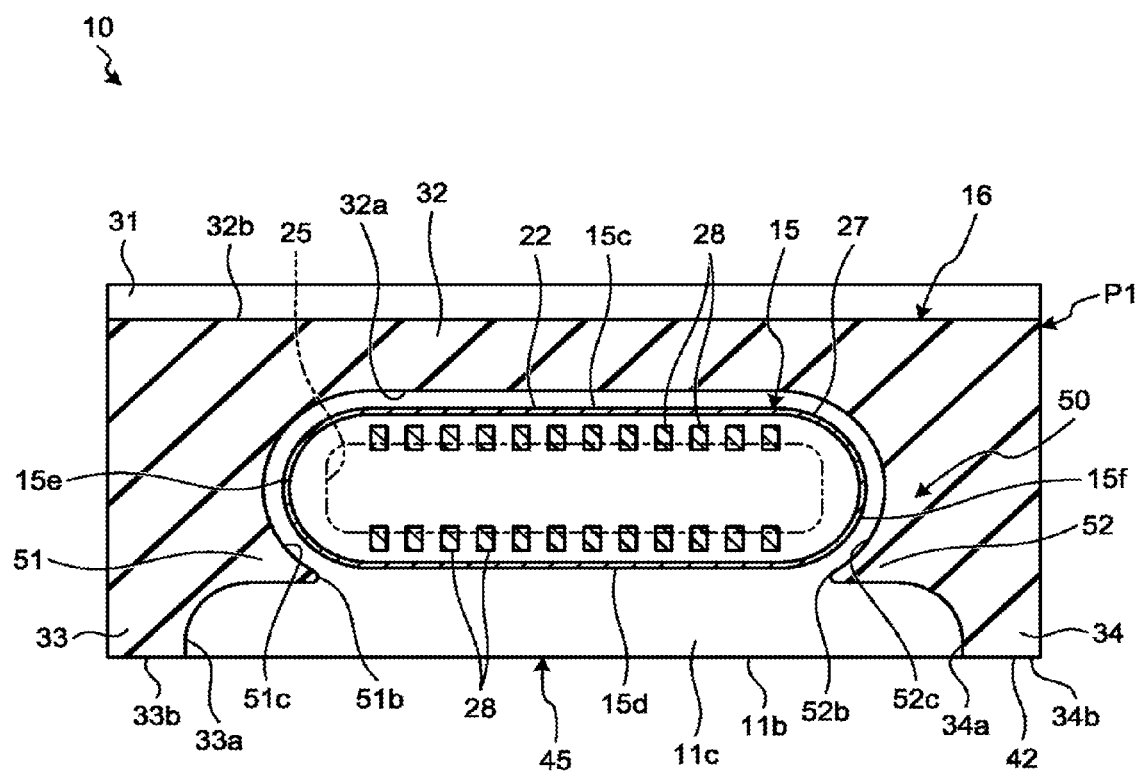
FIG. 8 is a sectional view of a USB drive according to a fourth embodiment.
Figure 8:
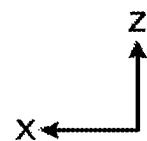

Hereinafter, a fourth embodiment will be described with reference to FIG. 8. FIG. 8 is a sectional view of the USB drive 10 according to the fourth embodiment. As illustrated in FIG. 8, the first hook 51 according to the fourth embodiment is formed integrally with the first side wall 33. In other words, the first hook 51 protrudes from the first side wall 33. The second hook 52 is formed integrally with the second side wall 34. In other words, the second hock 52 protrudes from the second side wall 34.

In the fourth embodiment, the cap 16 is made, for example, of synthetic rubber. Accordingly, the first hook 51 and the second hook 52 are made of synthetic rubber. A tensile modulus of each of the cap 16, the first hook 51, and the second hook 52 is lower than a tensile modulus of the shell 27 of the plug 15.

Similarly to the first embodiment, the first hook 51 and the second hook 52 hold the cap 16 that is at the first position P1 onto the plug 15. Each of the first hook 51 and the second hook 52 elastically deforms into a shape that allows the cap 16 to pivot from the first position P1 toward the second position P2. For example, each of the first hook 51 and the second hook 52 elastically deforms integrally with the cap 16, and thus, allows the cap 16 to pivot from the first position P1 toward the second position P2.

According to the fourth embodiment described above, the first hook 51 of the first stopper 50 may protrude from the first side wall 33. Furthermore, the second hook 52 of the first stopper 50 may protrude from the second side wall 34.

Fifth Embodiment

Figure 9:
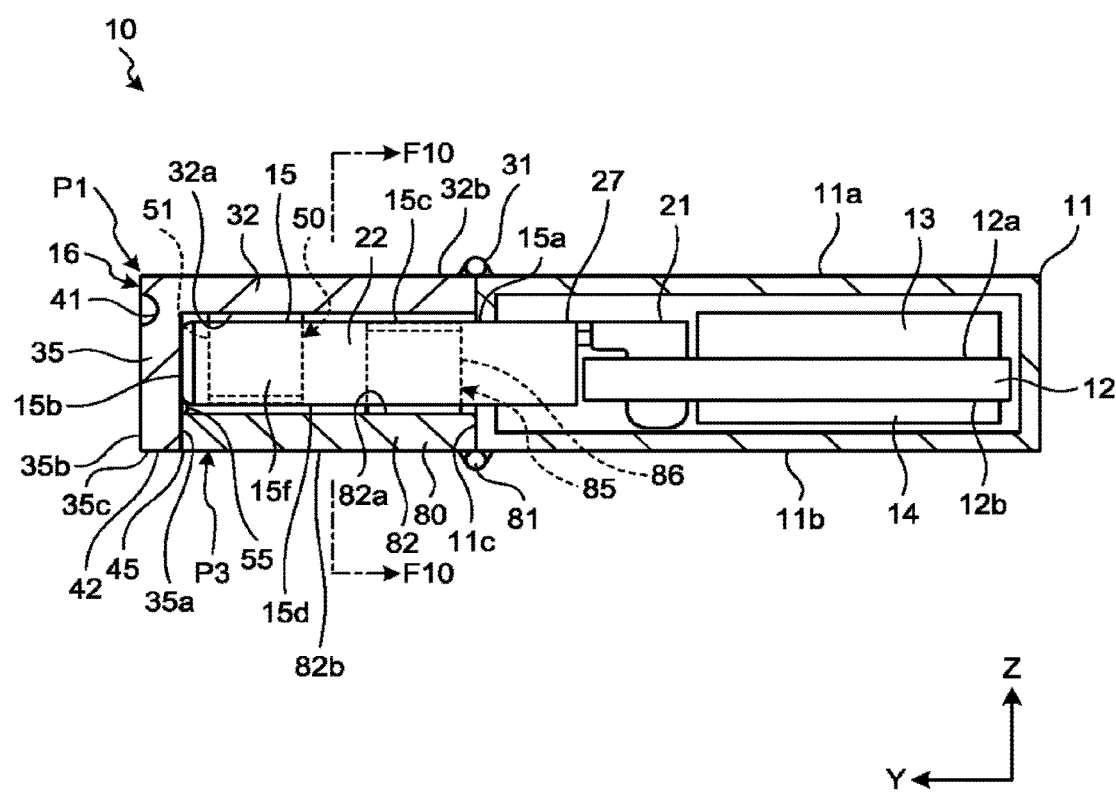
FIG. 9 is a sectional view of a USB drive according to a fifth embodiment.
Figure 10:
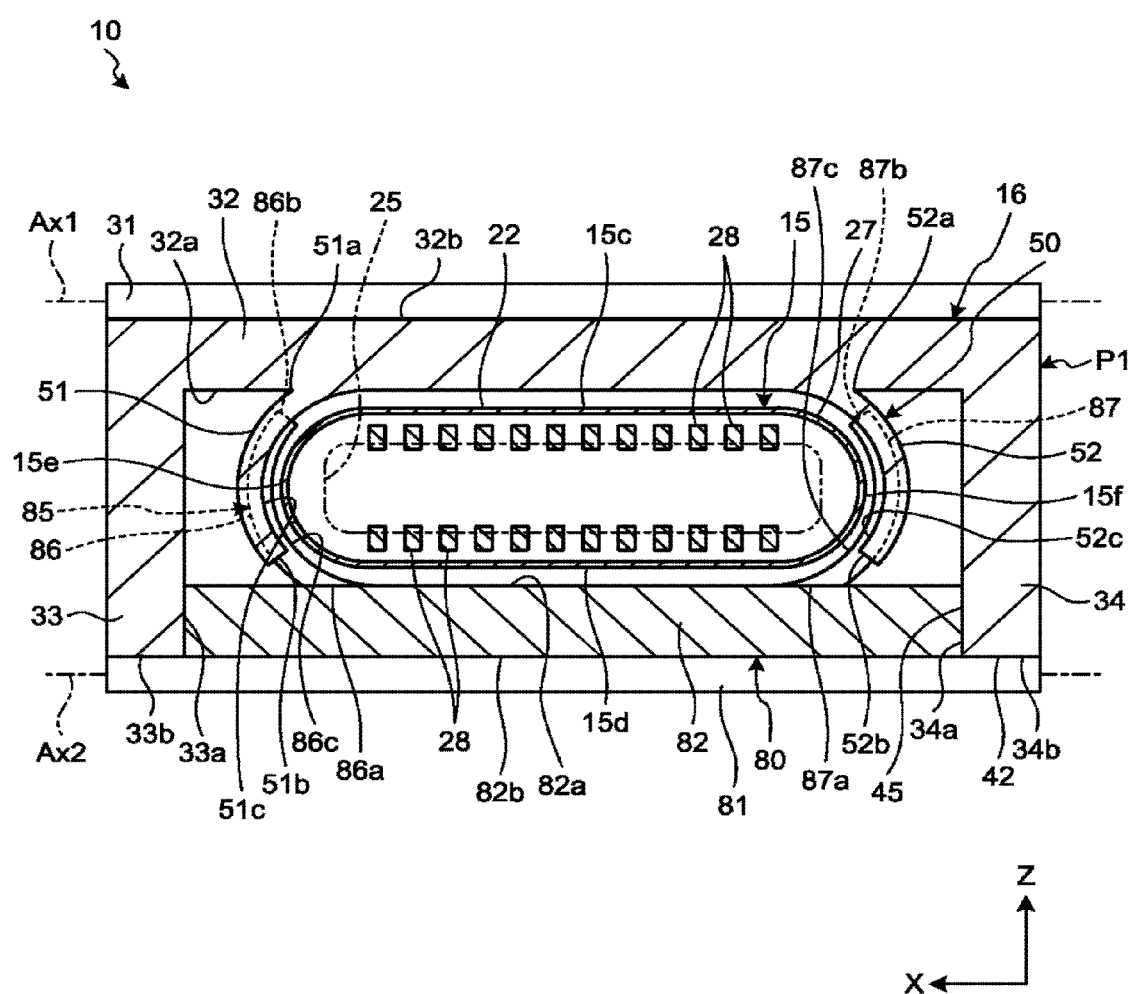
FIG. 10 is a sectional view of the USB drive according to the fifth embodiment taken along line F10-E10 in FIG. 9.

Hereinafter, a fifth embodiment will be described with reference to FIGS. 9 to 11. FIG. 9 is a sectional view of the USB drive 10 according to the fifth embodiment. FIG. 10 is a sectional view of the USB drive 10 according to the fifth embodiment taken along line F10-F10 in FIG. 9.

As illustrated in FIG. 9, the USB drive 10 according to the fifth embodiment includes a cover 80. The cover 80 is an example of a second cover. The cover 80 is formed in a plate-like shape. The cover 80 may be formed in another shape. The cover 80 is made, for example, of synthetic resin or metal. The cover 80 may be made of another material. The cover 80 includes a hinge 81 and a lower wall 82.

The hinge 81 is connected to the lower face 11b of the housing 11. For example, the hinge 81 includes a shaft extending in the direction along the X-axis. The shaft is supported by a protrusion protruding from the lower face 11b of the housing 11. With this configuration, the hinge 81 is connected to the housing 11 pivotably around a second axis Ax2 illustrated in FIG. 10. In other words, the cover 80 is integrated into the housing 11 pivotably around the second axis Ax2. The second axis Ax2 extends along the X-axis.

Figure 11:
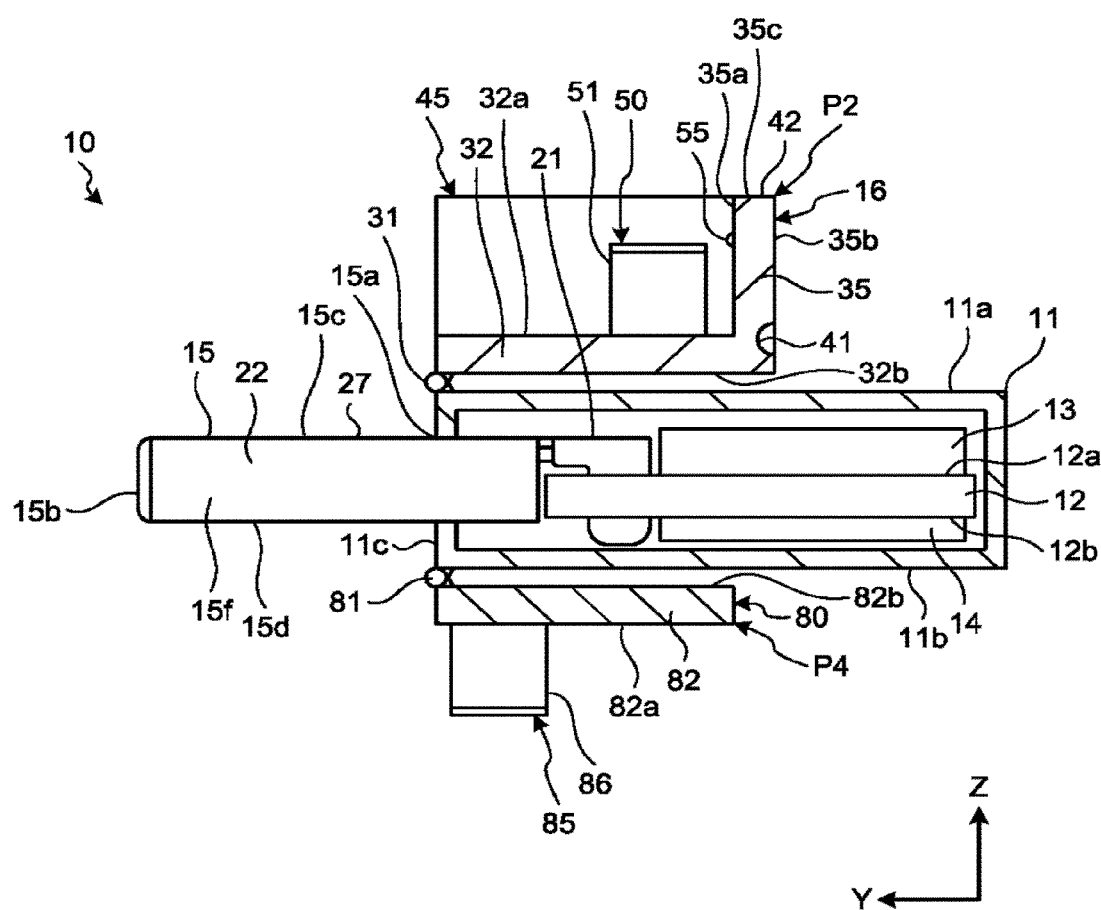
FIG. 11 is a perspective view of the USB drive with a cap and cover pivoted according to the fifth embodiment.

FIG. 11 is a perspective view of the USB drive 10 with the cap 16 and the cover 80 pivoted according to the fifth embodiment. The cover 80 is pivotable between a third position P3 illustrated in FIG. 9 and a fourth position P4 illustrated in FIG. 11.

As illustrated in FIG. 9, the cover 80 at the third position P3 covers the opening 45 of the cap 16 that is at the first position P1. As illustrated in FIG. 11, the cover 80 at the fourth position P4 is separated from the cap 16 and causes the plug 15 to be exposed. Hereinafter, the cover 80 at the third position P3 will be fundamentally described.

As illustrated in FIG. 9, the lower wall 82 extends from the hinge 81 in the positive direction along the Y-axis. The lower wall 82 is formed in a substantially quadrilateral plate-like shape expanding in the X-Y plane. The lower wall 82 includes a lower internal face 82a and a lower external face 82b. The lower external face 82b is an example of a seventh face.

The lower internal face 82a is a substantially flat face facing the positive direction along the Z-axis. At the third position P3, the lower internal face 82a faces the second flat face 15d of the plug 15. In other words, the second flat face 15d of the plug 15 faces the lower wall 82 when the cover 80 is at the third position P3. When the cover 80 is at the third position P3, the lower external face 82b faces the negative direction along the Z-axis. The negative direction along the Z-axis is an example of a second direction.

A third stopper 85 is provided on the cover 80. As illustrated in FIG. 10, the third stopper 85 includes a third hook 86 and a fourth hook 87. The third stopper 85 can also be referred to, for example, as a holder, a fitting unit, a locking unit, a recess, or a spring.

The third hook 86 and the fourth hook 87 are located between the first side wall 33 and the second side wall 34, each of which is at the first position P1, in the direction along the X-axis. At least a portion of the third hook 86 at the third position P3 is located between the first side wall 33 that is at the first position P1 and the plug 15. At least a portion of the fourth hook 87 at the third position P3 is located between the second side wall 34 that is at the first position P1 and the plug 15. In other words, the plug 15 is located between the third hook 86 and the fourth hook 87 each of which is at the third position P3.

The third hook 86 protrudes from the lower internal face 82a of the lower wall 82. The third hook 86 is an arcuate plate curved toward the first side wall 33 and extends in the direction along the Y-axis. The third hook 86 may be formed in another shape. The third hook 86 is separated from the first side wall 33 that is at the first position P1. The third hook 86 may come in contact with the first side wall 33.

The third hook 86 includes a third proximal end portion 86a and a third distal end portion 86b. The third proximal end portion 86a is connected to the lower internal face 82a of the lower wall 82. The third distal end portion 86b is located on an opposite side of the third proximal end portion 86a. The third distal end portion 86b is separated from the lower wall 82.

The third hook 86 with an arcuate shape includes a third internal face 86c. The third internal face 86c faces the first curved face 15e of the plug 15, at the third position P3. The third internal face 86c is a curved face recessed in a direction where the first curved face 15e protrudes. A radius of curvature of the third internal face 86c is substantially equal to the radius of curvature of the curved face 15e. The radius of curvature of the third internal face 86c may differ from the radius of curvature of the first curved face 15e.

The third hook 86 is hooked on the first curved face 15e of the plug 15 so as to hold the cover 80 that is at the third position P3, onto the plug 15. Specifically, at the third position P3, the upper half of the first curved face 15e faces the third hook 86. In other words, in the direction along the Z-axis, a portion of the plug 15 is located between the lower wall 82 and the third distal end portion 86b of the third hook 86 when the cover 80 is at the third position P3. When the cover 80 pivots from the third position P3 to the fourth position P4, the third hock 86 comes in contact with the upper half of the first curved face 15e. With this configuration, the third hook 86 holds the cover 80 onto the plug 15 and thus prevents the cover 80 from pivoting from the third position P3 toward the fourth position P4.

At the third position P3, the third hook 86 may be separated from the plug 15. However, when the cover 80 slightly pivots from the third position P3 to the fourth position P4, the third hook 86 comes in contact with the upper half of the first curved face 15e.

At the third position P3, in a plan view of the first flat face 15c of the plug 15, the third distal end portion 86b of the third hook 86 is located outside of the first flat face 15c and overlaps with the first curved face 15e. In a plan view of the first flat face 15c of the plug 15, the third distal end portion 86b of the third hook 86 at the third position P3 may overlap with the first flat face 15c.

When the cover 80 is pivoted from the third position P3 to the fourth position P4, the third hook 86 is pressed by the plug 15. A tensile modulus of the third hook 86 is lower than a tensile modulus of the shell 27 of the plug 15. Therefore, when a force acting from the third hook 86 onto the plug 15 is increased, the third hook 86 elastically deforms.

The third hook 86 elastically deforms in a direction that is a pivoting axial direction of the cover 80 and that is the separating direction from the plug 15. In other words, the third hook 86 elastically deforms so as to be separated from the fourth hook 87 and to approach the first side wall 33. The pivoting axial direction of the cover 80 is a direction where the second axis Ax2 extends.

The third hook 86 elastically deforms into a shape that allows the cover 80 to pivot from the third position P3 toward the fourth position P4. For example, the third distal end portion 86b of the third hook 86 comes in contact with the upper half of the first curved face 15e at the third position P3. When the third hook 86 elastically deforms, the third distal end portion 86b approaches the lower half of the first curved face 15e. Subsequently, the third hock 86 elastically deforms into a shape that causes the third distal end portion 86b to come in contact with the lower half of the first curved face 15e. At this time, the third hook 86 allows the cover 80 to pivot from the third position P3 toward the fourth position P4.

When the cover 80 further pivots, the third hook 86 is separated from the plug 15, so as to remove a force acting from the third hook 86 onto the plug 15. Accordingly, the third hook 86 returns to its original shape. At this time, the plug 15 moves to the outside from a space between the lower wall 82 and the third distal end portion 86b of the third hook 86. When the cover 80 pivots from the fourth position P4 toward the third position P3, the third hook 86 also elastically deforms in the direction that is the pivoting axial direction of the cover 80 and the separating direction from the plug 15.

The fourth hook 87 protrudes from the lower internal face 82a of the lower wall 82. The fourth hook 87 is an arcuate plate curved toward the second side wall 34 and extends in the direction along the Y-axis. The fourth hook 87 may be formed in another shape. The fourth hook 87 is separated from the second side wall 34 that is at the first position P1. The fourth hook 87 may come in contact with the second side wall 34.

The fourth hook 87 includes a fourth proximal end portion 87a and a fourth distal end portion 87b. The fourth proximal end portion 87a is connected to the lower internal face 82a of the lower wall 82. The fourth distal end portion 87b is located on an opposite side of the fourth proximal end portion 87a.

The fourth hook 87 with an arcuate shape includes a fourth internal face 87c. The fourth internal face 87c faces the second curved face 15f of the plug 15, at the third position P3. The fourth internal face 87c is a curved face recessed in a direction where second curved face 15f protrudes. A radius of curvature of the fourth internal face 87c is substantially equal to the radius of curvature of the second curved face 15f. The radius of curvature of the fourth internal face 87c may differ from the radius of curvature of the second curved face 15f.

The fourth hook 87 is hooked on the second curved face 15f of the plug 15 so as to hold the cover 80 onto the plug 15, at the third position P3. In the direction along the Z-axis, a portion of the plug 15 is located between the lower wall 82 and the fourth distal end portion 87b of the fourth hook 87 when the cover 80 is at the third position P3. Similarly to the third hook 86, when the cover 80 pivots from the third position P3 toward the fourth position P4, the fourth hook 87 elastically deforms in the direction that is the pivoting axial direction of the cover 80 and that is the separating direction from the plug 15. When the cover 80 pivots from the fourth position P4 toward the third position P3, the fourth hook 87 also elastically deforms in the direction that is the pivoting axial direction of the cover 80 and that is the separating direction from the plug 15.

The first hook 51 at the first position P1 and the third hook 86 at the third position P3 are aligned in the direction along the Y-axis. The second hook 52 at the first position P1 and the fourth hook 87 at the third position P3 are aligned in the direction along the Y-axis.

As described above, the cap 16 is pivotable from the first position P1 to the second position P2. The cover 80 is pivotable from the third position P3 to the fourth position P4. The cap 16 at the second position P2 and the cover 80 at the fourth position P4 cause the plug 15 be exposed. When the cover 80 is at the fourth position P4, the lower external face 82b of the lower wall 82 faces the lower face 11b of the housing 11. The exposed inserting portion 22 of the plug 15 can be inserted into the USB, Type-C female connector.

On the USB drive 10 according to the fifth embodiment, the cover 80 is pivotable between the third position P3 and the fourth position P4. At the third position P3, the lower external face 82b of the cover 80 faces the negative direction along the Z-axis. At the fourth position P4, the lower external face 82b faces the lower face 11b of the housing 11. The cover 80 at the third position P3 covers the plug 15, and the cover 80 at the fourth position P4 causes the plug 15 to be exposed. This configuration protects the plug 15 more reliably.

The third stopper 85 on the cover 80 is configured to come in contact with the plug 15 and to elastically deform in the direction that is the pivoting axial direction of the cover 80 and that is the separating direction from the plug 15 when the cover 80 pivots from the third position P3 to the fourth position P4. This configuration suppresses accidentally pivoting of the cover 80 from the third position P3 to the fourth position P4.

The first stopper 50 and the third stopper 85 are aligned in a direction where the plug 15 extends. This configuration makes it possible to easily provide the first stopper 50 and the third stopper 85.

In the above-described plurality of embodiments, the plug 15, which is a USB Type-C male connector, is an example of a connector. However, the connector is not limited to the plug 15. The connector may be a male connector of USB Type-A, mini USB, micro USE, or HDMI, or another connector, for example.

Furthermore, in the above-described plurality of embodiments, the hinge 31 is an example of a connecting unit. However, the connecting unit is not limited to the hinge 31 but may be an elastic portion that is fixed, adhered, or integrated to the housing 11. For example, the cap 16 may be made of synthetic rubber and an end portion of the upper wall 32 in the negative direction along the Y-axis may be connected to the housing 11. The end portion is an example of the connecting unit. Using the configuration in which the end portion elastically deforms, the cap 16 is pivotable between the first position P1 and the second position P2. Pivoting of the cap 16 is not limited to arcuate pivoting but may be eccentric pivoting, for example.

Furthermore, in the above-described plurality of embodiments, the first stopper 50 and the second stopper 55 are provided on the cap 16. However, it is possible to configure such that the first stopper 50 alone is provided on the cap 16 and the second stopper 55 is omitted.

According to at least one embodiment described above, the first cover is connected to the housing and pivotable between the first position and the second position. When the first cover pivots from the first position to the second position, the first stopper of the first cover comes in contact with the connector and can be elastically deformed in a direction that is a pivoting axial direction of the first cover and that is a separating direction from the connector. This configuration allows the first cover to easily move from the first position to the second position. Furthermore, since the first cover is connected to the housing, loss of the first cover is suppressed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic device comprising:
a housing including a first face facing a first direction, a second face on an opposite side of the first face, and a third face adjacent to the first face and the second face;
a connector protruding from the third face; and
a first cover that is connected to the housing and includes a fourth face, the first cover being pivotable between a first position at which the fourth face faces the first direction and a second position at which the fourth face faces the first face,
wherein the first cover includes a connecting unit connected to the housing and a first wall extending from the connecting unit,
the connector includes a fifth face that faces the first wall that is at the first position, and a sixth face on an opposite side of the fifth face, and
the first cover forms a second opening that houses the connector and opens in a direction the sixth face faces, at the first position.

2. The electronic device according to claim 1,
wherein the first cover includes a first stopper that, when the first cover pivots from the first position to the second position, comes in contact with the connector and is elastically deformable in a direction that is a pivoting axial direction of the first cover and that is a separating direction from the connector.

3. The electronic device according to claim 2,
wherein a tensile modulus of the first stopper is lower than a tensile modulus of the connector.

4. The electronic device according to claim 2, wherein the first stopper protrudes from the first wall.

5. The electronic device according to claim 4,
wherein, in the first direction, the connector is located between the first wall and a distal end portion of the first stopper when the first cover is at the first position.

6. The electronic device according to claim 4,
wherein the first cover includes a second wall protruding from the first wall and a third wall protruding from the first wall,
the second wall includes a first internal face facing the connector at the first position,
the third wall includes a second internal face that faces the connector at the first position and that faces the first internal face, and
the first stopper is located between the second wall and the third wall.

7. The electronic device according to claim 6,
wherein the connector includes a fifth face that faces the first wall when the first cover is at the first position, a sixth face on the opposite side of the fifth face, a first curved face that connects the fifth face with the sixth face and faces the second wall and protrudes toward the second wall when the first cover is at the first position, and a second curved face that connects the fifth face with the sixth face and faces the third wall and protrudes toward the third wall when the first cover is at the first position, and
the first stopper is configured to come in contact with at least one of the first curved face and the second curved face when the first cover pivots from the first position to the second position.

8. The electronic device according to claim 7,
wherein the connector includes a first end portion that is connected to the housing, a second end portion located on an opposite side of the first end portion in a protruding direction from the third face, and a terminal,
the second end portion is provided with a first opening configured to enable the terminal to be connected with an external apparatus, and
the first cover includes a fourth wall that faces the first opening at the first position.

9. The electronic device according to claim 8,
wherein the first cover further includes a second stopper that protrudes from the fourth wall and that, when the first cover pivots from the first position toward the second position, comes in contact with the connector and is elastically deformable so as to be separated from the second end portion.

10. The electronic device according to claim 8,
wherein the fourth wall includes a third internal face that faces the connector at the first position, an external face on an opposite side of the third internal face, and at least one of a protrusion or a recess on the external face.

11. The electronic device according to claim 7,
wherein the first stopper includes a first hook separated from the second wall, and
the first hook is configured to come in contact with the first curved face when the first cover pivots from the first position to the second position.

12. The electronic device according to claim 11,
wherein the first hook includes a proximal end portion connected to the first wall and a distal end portion on an opposite side of the proximal end portion,
in a plan view in a protruding direction from the third face, a distance between the second wall and a point, on the first curved face, closest to the second wall is shorter than a distance between the distal end portion and the second wall, and in the plan view in a protruding direction from the third face, the distance between the distal end portion and the second wall is shorter than a distance between a point connecting the first curved face with the sixth face and the second wall.

13. The electronic device according to claim 11,
wherein the first hook includes a proximal end portion connected to the first wall and a distal end portion on an opposite side of the proximal end portion, and in a plan view of the sixth face, the distal end portion is located outside of the sixth face, at the first position.

14. The electronic device according to claim 11,
wherein the first stopper includes a second hook separated from the third wall, and the second hook is configured to come in contact with the second curved face when the first cover pivots from the first position to the second position.

15. The electronic device according to claim 7,
wherein the second wall includes an edge portion on an opposite side of the first wall, and the sixth face of the connector is closer to the first wall than the edge portion is, at the first position.

16. The electronic device according to claim 7,
wherein the first stopper includes a third curved face that is configured to face the first curved face at the first position and is recessed in a direction where the first curved face protrudes.

17. The electronic device according to claim 7,
wherein the connector includes a hole on the sixth face, and the first stopper covers the hole at the first position.

18. The electronic device according to claim 1, further comprising a second cover that is connected to the housing and includes a seventh face, the second cover being pivotable between a third position in which the seventh face faces a second direction opposite to the first direction and a fourth position in which the seventh face faces the second face.

19. The electronic device according to claim 18,
wherein the second cover further includes a third stopper that, when the second cover pivots from the third position to the fourth position, comes in contact with the connector and is elastically deformable in a direction that is a pivoting axial direction of the second cover and that is a separating direction from the connector.

20. The electronic device according to claim 1,
wherein the connector includes a USB Type-C male connector.

* * * * *